United States Patent
Liu et al.

(10) Patent No.: US 9,852,991 B2
(45) Date of Patent: Dec. 26, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Jiquan Liu, Shanghai (CN); Ming Zhou, Shanghai (CN); Charles Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/168,628

(22) Filed: May 31, 2016

(65) Prior Publication Data

US 2016/0351496 A1  Dec. 1, 2016

(30) Foreign Application Priority Data

Jun. 1, 2015  (CN) .......................... 2015 1 0293278

(51) Int. Cl.
*H01L 21/321* (2006.01)
*H01L 21/768* (2006.01)
*H01L 23/532* (2006.01)
*H01L 21/02* (2006.01)

(52) U.S. Cl.
CPC .. *H01L 23/53238* (2013.01); *H01L 21/02074* (2013.01); *H01L 21/76849* (2013.01); *H01L 21/76867* (2013.01); *H01L 21/76883* (2013.01); *H01L 23/5329* (2013.01)

(58) Field of Classification Search
CPC .................... H01L 21/76883; H01L 23/53238
See application file for complete search history.

(56) References Cited

U.S. PATENT DOCUMENTS

| | | | |
|---|---|---|---|
| 8,072,075 B2 * | 12/2011 | Jourdan | H01L 21/76831 257/758 |
| 2006/0046479 A1 * | 3/2006 | Rajagopalan | C23C 16/325 438/683 |
| 2009/0107626 A1 * | 4/2009 | Lee | H01L 21/7681 156/275.7 |
| 2010/0025852 A1 | 2/2010 | Ueki et al. | |

* cited by examiner

*Primary Examiner* — Raj R Gupta
(74) *Attorney, Agent, or Firm* — Anova Law Group, PLLC

(57) ABSTRACT

A method for fabricating a semiconductor structure includes providing a dielectric layer on a semiconductor substrate, forming an opening in the dielectric layer to expose a portion of the surface of the semiconductor substrate, forming a metal layer to fill up the opening, and removing the portion of the metal layer formed above the top surface of the dielectric layer by polishing. A metal oxide layer is formed on the surface of the metal layer after polishing. The method further includes removing the metal oxide layer from the top surface of the metal layer, forming a metal barrier layer on the top surface of the metal layer after the removal of the metal oxide layer to provide a more uniform thickness and a denser texture, and converting the metal barrier layer to a metal cap layer by introducing a silicon-containing gas onto a surface of the metal barrier layer.

18 Claims, 4 Drawing Sheets

SEMICONDUCTOR STRUCTURE AND FABRICATION METHOD THEREOF

CROSS-REFERENCES TO RELATED APPLICATIONS

This application claims the priority of Chinese Patent Application No. CN201510293278.7, filed on Jun. 1, 2015, the entire content of which is incorporated herein by reference.

FIELD OF THE DISCLOSURE

The present disclosure generally relates to the field of semiconductor fabrication technology and, more particularly, relates to a semiconductor device and fabrication method thereof.

BACKGROUND

With the development of semiconductor technology, the degree of integration of very large semiconductor integration (VLSI) chips has reached a scale of having nearly one or even several billions of devices in a single chip. A technique with two or more layers of metal interconnections has been widely adopted to meet the development requirements.

Traditional metal interconnections are made of aluminum. However, as the feature size of devices in integrated circuits (ICs) continuously decreases, the circuit density in metal interconnections steadily increases and the required responding time is continuously reduced. Therefore, the traditional aluminum interconnections cannot meet the requirement and, thus, a copper interconnection technique has gradually used to replace the aluminum interconnection technique.

Compared to aluminum, copper shows lower electrical resistivity and higher electromigration resistance. Therefore, using copper interconnections, resistor-capacitor (RC) delay of interconnections may be reduced, electromigration resistance may be improved and, thus, stability of the device may also be improved.

However, the existing copper interconnection technique may still have its drawbacks. Specifically, as a metal, copper still has relatively high migration mobility, thus diffusion of copper atoms in silicon and silicon oxides as well as in most of dielectric materials is very quick. Further, once copper atoms are diffused into semiconductor substrate or dielectric layer, the life time of the minority charge carriers in the device and the leakage current in the junction may be affected. In addition, as copper atoms diffused into semiconductor substrate or dielectric layer, electromigration in the semiconductor structure may also increase, which may further cause circuit failure in the semiconductor structure and degradation of the reliability. Being distinct from aluminum interconnections, where failure of the aluminum interconnections is caused by diffusion of aluminum atoms along the boundary of grains, the electromigration failure in copper interconnections may be caused by diffusion of copper atoms along surfaces and interfaces.

When using the copper interconnection technique to fabricate semiconductor structures, the electromigration problems may still be prominent and the electrical performance of the semiconductor structures may also need to be improved. The fabrication method and device structure in the present disclosure are directed to solve one or more problems set forth above and other problems in the art.

BRIEF SUMMARY OF THE DISCLOSURE

One aspect of the present disclosure includes a method for fabricating a semiconductor structure. The method includes providing a dielectric layer on the top surface of a semiconductor substrate, forming an opening in the dielectric layer to expose a portion of the top surface of the semiconductor substrate, forming a metal layer to fill up the opening and to cover the top surface of the dielectric layer, and then removing the portion of the metal layer formed above the top surface of the dielectric layer by polishing. A metal oxide layer is formed on a top surface of the metal layer after polishing. The method further includes removing the metal oxide layer from the top surface of the metal layer, forming a metal barrier layer on the top surface of the metal layer after the removal of the metal oxide layer to provide a more uniform thickness and a denser texture, and converting the metal barrier layer to a metal cap layer by introducing a silicon-containing gas onto a surface of the metal barrier layer.

Another aspect of the present disclosure provides a semiconductor structure. The semiconductor structure includes a semiconductor substrate, a dielectric layer formed on a top surface of the semiconductor substrate, an opening formed in the dielectric layer to expose a portion of the top surface of the semiconductor substrate, a metal layer formed to fill up the opening, and a metal cap layer formed on a top surface of the metal layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
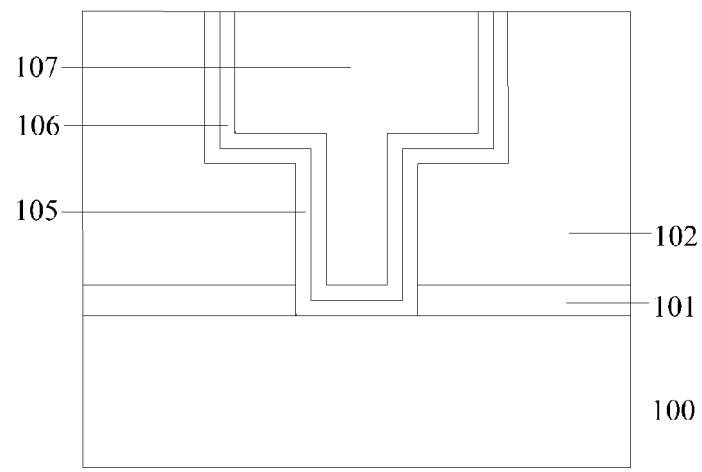
FIG. 1 illustrates a schematic cross-section view of a semiconductor structure fabricated by a conventional method.

As described in the background section, for semiconductor structures fabricated by existing methods using the copper interconnection technique, the electromigration problems may still be prominent and the electrical performance may also need to be improved. In the following, a semiconductor structure fabricated by an existing method is provided to further illustrate the problems in the current technology. FIG. 1 shows a schematic cross-section view of the semiconductor structure fabricated by an existing method.

The fabrication method for the semiconductor structure shown in FIG. 1 includes providing a semiconductor substrate 100. A dielectric layer may be formed on the surface of the semiconductor substrate 100. The dielectric layer may further include an etching stop layer 101 formed on the surface of the semiconductor substrate 100 and a dielectric material layer 102 formed on the surface of the etching stop layer 101. The fabrication method further includes forming an opening in the dielectric layer. A portion of the surface of the semiconductor substrate 100 may be exposed in the bottom of the opening. The fabrication method also includes forming a metal layer to fill up the opening. The metal layer may include a barrier layer 105 formed on the bottom and the sidewall surfaces of the opening, a seed layer 106, and a metal body layer 107. The surface of the metal layer may be leveled with the top surface of the dielectric layer.

The metal body layer 107 is made of copper. Copper atoms have relatively high migration mobility in silicon and silicon oxides. Under impact of electrons, copper atoms may easily migrate. Therefore, copper atoms in the metal layer may easily diffuse into the dielectric layer in the upper-layer interconnection, causing electromigration problems. A metal cap layer formed on the surface of the metal body layer 107 may be required to prevent copper atoms from diffusing into the dielectric layer. In addition, the metal cap layer may also prevent $O_2$ in ambient air from diffusing into the metal body layer 107. Therefore, poor reliability of the semiconductor structure caused by oxidation of copper may be avoided and electromigration problems in the semiconductor structure may also be resolved.

To a certain extent, using a copper silicon nitride compound to form such a metal cap layer may help resolving electromigration problems in semiconductor structures. However, the electrical resistivity of the metal body layer 107 in semiconductor structures may increase and electromigration problems in semiconductor structures may not be completely resolved.

Further, $SiH_4$ and $NH_3$ are commonly used to treat the surface of the metal body layer 107 to form a self-aligned metal cap layer on the surface of the metal body layer 107. When $SiH_4$ is brought to contact with the surface of the metal body layer 107, silicon atoms in $SiH_4$ may easily diffuse into the metal body layer 107. Further, because silicon atoms have a relatively large diffusion rate in the metal body layer 107, the electrical resistance of the metal body layer 107 may increase.

Prior to performing the surface treatment process on the metal body layer 107 using $SiH_4$ and $NH_3$, a metal oxide layer may be formed on the surface of the metal body layer 107. The metal oxide layer may primarily come from two sources: a native oxide layer formed due to direct contact between oxygen in ambient air and the surface of the metal body layer 107 and a chemical oxide layer due to oxidation reaction between the surface of the metal body layer 107 and a polishing fluid during a chemical mechanical polishing process performed on the metal body layer 107.

To a certain extent, the metal oxide layer may prevent $SiH_4$ from diffusing into the metal body layer 107. However, because the oxidation degree of the native oxide layer and the chemical oxide layer is relatively low, the texture of the metal oxide layer may be porous and the thickness of the metal oxide layer may not be uniform. Specifically, the thickness of the metal oxide layer on some areas of the surface of the metal body layer 107 may be relatively large while the thickness of the metal oxide layer on the other areas of the surface of the metal body layer 107 may be relatively small, or may even be zero. Therefore, the metal oxide layer may not have desired performance in preventing $SiH_4$ from diffusing into the metal body layer 107. That is, $SiH_4$ may still diffuse into the metal body layer 107, causing increase in the electrical resistance of the metal body layer 107.

In the meantime, because the texture of the metal oxide layer may be porous, the texture of the metal cap layer formed by introducing $SiH_4$ and $NH_3$ onto the surface of the metal oxide layer may also be porous. Therefore, the quality of the formed metal cap layer may be poor and the ability of the metal cap layer to block migration of copper atoms may also be weak. Thus, electromigration problems in the semiconductor structure may still be relatively severe.

Figure 11:
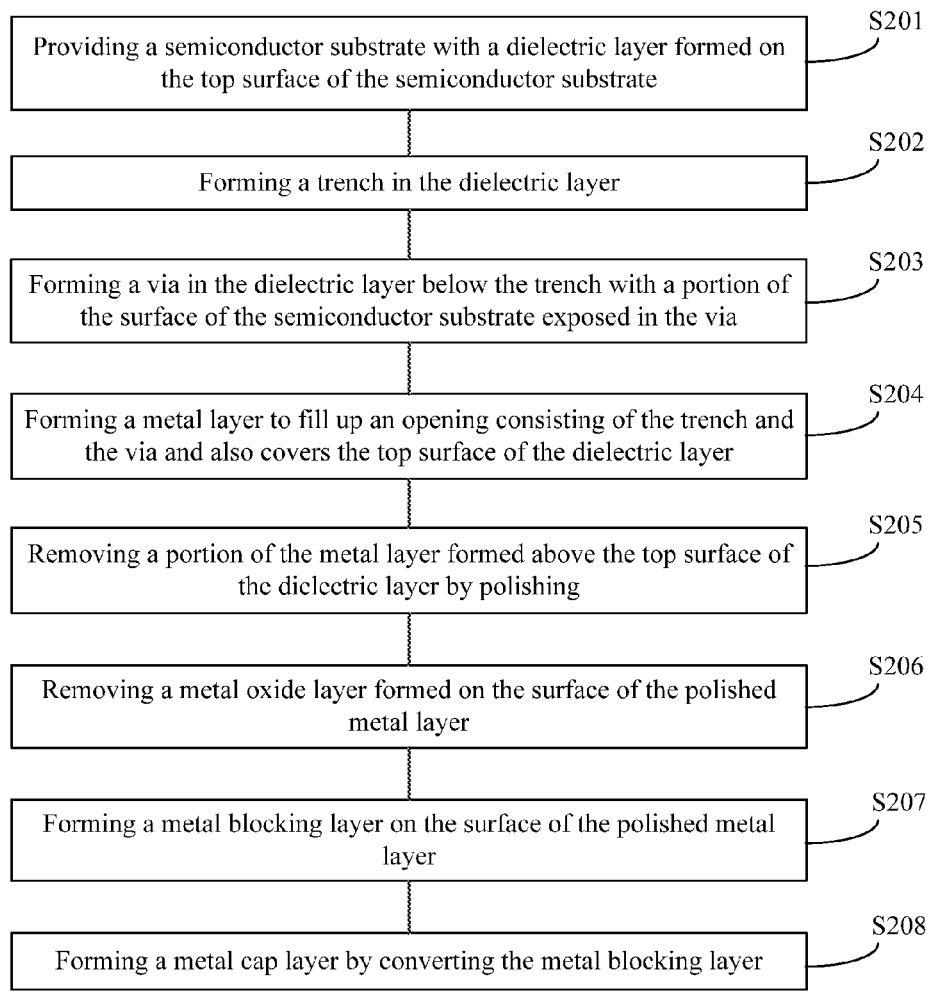
FIG. 11 illustrates a flowchart of the exemplary fabrication process consistent with disclosed embodiments.

The present disclosure provides a fabrication method to solve the problems in existing methods as described above. FIG. 11 shows a flowchart of an exemplary fabrication process consistent with disclosed embodiments.

Figure 2:
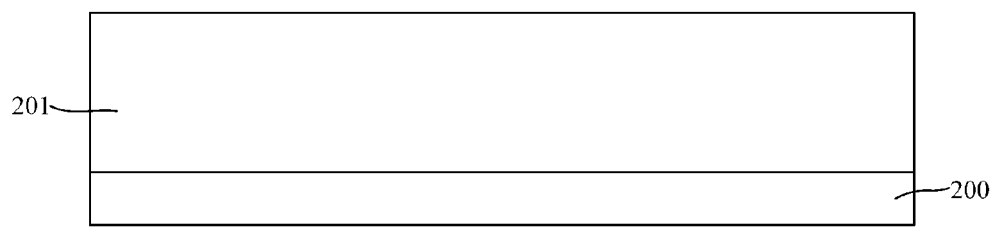
FIGS. 2-10 illustrate schematic views of semiconductor structures corresponding to certain stages of an exemplary fabrication method consistent with disclosed embodiments.

Referring to FIG. 11, at the beginning of the fabrication process, a semiconductor substrate is provided (S201). FIG. 2 shows a schematic cross-section view of the provided semiconductor substrate 200.

Referring to FIG. 2, a dielectric layer 201 may be formed on the surface of the semiconductor substrate 200.

The semiconductor substrate 200 may be made of Si, Ge, SiGe, SiC, or GaAs. The semiconductor substrate 200 may also be made of silicon on insulator (SOI) or germanium on insulator (GOI). In one embodiment, the semiconductor substrate 200 is made of Si.

Semiconductor devices may be formed in the semiconductor substrate 200. The pre-formed semiconductor devices may include metal-oxide-semiconductor (MOS) transistors, capacitors, resistors, inductors, etc. A metal wiring layer may also be formed on the surface of the semiconductor substrate 200. The metal wiring layer may be used to electrically connect to a subsequently-formed metal layer.

The dielectric layer 201 may be made of SiO, SiN, SiON, low-k dielectric material, or ultra-low-k dielectric material. The dielectric layer 201 may be formed by a chemical vapor deposition (CVD), physical vapor deposition (PVD), atomic layer deposition (ALD), or spin coating process.

The low-k dielectric material may refer to a dielectric material with a relative permittivity (or dielectric constant) higher than or equal to 2.6 but lower than 3.9, while the ultra-low-k dielectric material may refer to a dielectric material with a relative permittivity below 2.6.

When the dielectric layer 201 is made of a low-k dielectric material or an ultra-low-k dielectric material, the material of dielectric layer 201 may be one of SiOH, SiCOH, FSG (fluorosilicate glass), BSG (borosilicate glass), PSG (phosphosilicate glass), BPSG (borophosphosilicate glass), HSQ (hydrogen silsesquioxane, $(HSiO_{1.5})_n$), and MSQ (methyl silsesquioxane, $(CH_3SiO_{1.5})_n$).

In one embodiment, the dielectric layer 201 is made of a low-k dielectric material to reduce RC delay effect in the semiconductor structure.

In certain other embodiments, an etching stop layer may also be formed between the semiconductor substrate and the dielectric layer. That is, prior to the formation of the dielectric layer, an etching stop layer may be formed on the surface of the semiconductor substrate. The etching stop layer is made of a material different from the material used to form the dielectric layer. In a subsequent etching process, the etching rate on the etching stop layer may be far below the etching rate on the dielectric layer. Therefore, the etching stop layer may serve as an indicator to stop the etching process so that during the etching process, excessive etching on the semiconductor substrate may be avoided. The etching stop layer may be made of SiN, carbon doped SiN, SiC, or SiON.

In a subsequent process, an opening may be formed in the dielectric layer 201. For illustration purposes, the opening formed in the dielectric layer 201 is described to include a trench and a via, interconnecting with each other and the via formed below the trench. In the following, a detailed description on forming the trench and the via provides an example for the fabrication of an opening in the dielectric layer 201. In other embodiments, the opening may have any other appropriate structure.

Figure 3:
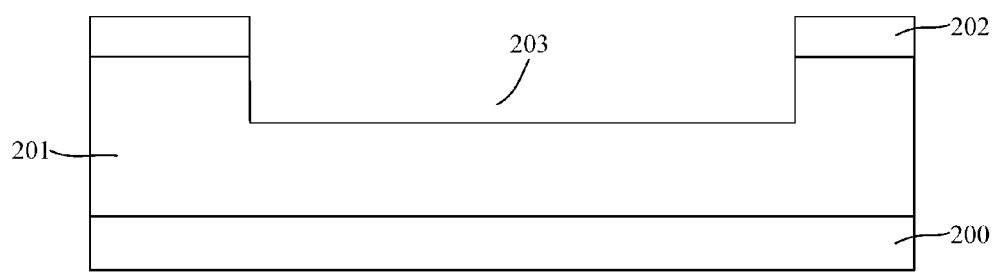

Returning to FIG. 11, a trench may be formed in the dielectric layer (S202). FIG. 3 shows a schematic view of the corresponding semiconductor structure with a trench 203 formed in the dielectric layer 201.

Referring to FIG. 3, a patterned first mask layer 202 may be formed on the surface of the dielectric layer 201. The patterned first mask layer 202 covers most of the surface of the dielectric layer 201 with only a portion of the surface of the dielectric layer 201 exposed. Then, the trench 203 may be formed by removing a portion of the dielectric layer 201 though an etching process. During the etching process, the patterned first mask layer 202 may serve as an etch mask so that the etching process may be performed along the exposed portion of the surface of the dielectric layer 201.

The patterned first mask layer 202 may define the position and the width of the trench 203. The patterned first mask layer 202 may have a single-layer or a multiple-layer structure. The patterned first mask layer 202 may be made of one or more of photoresist, SiN, metallic mask material, and other appropriate mask material. The metallic mask material may include TiN, TaN, etc.

In one embodiment, the patterned first mask layer 202 is made of SiN. The trench 203 is formed in the dielectric layer 201 by removing a portion of the dielectric layer 201 through a dry etching process using the patterned first mask layer 202 as an etch mask.

The side surfaces of the trench 203 may be perpendicular to the surface of the semiconductor substrate 200. That is, the top width of the trench 203 may be the same as the bottom width of the trench 203. In certain other embodiments, the top width of the trench may be larger than the bottom width of the trench 203.

In one embodiment, the width of the trench 203 may be in a range of 20 nm to 80 nm while the depth of the trench 203 may be in a range of 20 nm to 200 nm.

After forming the trench 203, the patterned first mask layer 202 may then be removed. For example, the patterned first mask layer 202 may be removed by etching.

Figure 4:
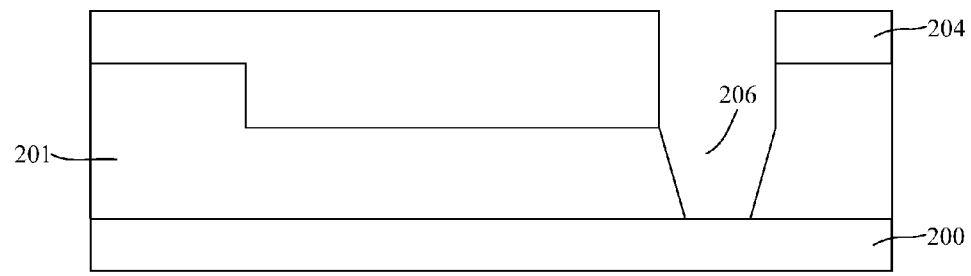

Further, returning to FIG. 11, a via may be formed in the dielectric layer below the trench to expose a portion of the surface of the semiconductor substrate (S203). FIG. 4 shows a schematic cross-section view of the corresponding semiconductor structure with a via 206 formed in the dielectric layer 201 below the trench 203.

Referring to FIG. 4, a patterned second mask layer 204 may be formed to cover most of the bottom surface of the trench 203 (referring to FIG. 3) as well as the top surface of the dielectric layer 201. The patterned second mask layer 204 may expose a portion of the surface of the dielectric layer 201 on the bottom of the trench 203. Then, a via 206 may be formed by etching the dielectric layer 201 using the patterned second mask layer 204 as an etch mask until reaching the surface of the semiconductor substrate 200. In another embodiment, an etching stop layer may be formed between the semiconductor substrate and the dielectric layer. Correspondingly, the etching process for forming the via in the dielectric layer may be stopped as the etching stop layer is reached.

In one embodiment, the patterned second mask layer 204 may define the position and the size of the via 206. The patterned second mask layer 204 may be made of one or more of photoresist, SiN, metallic mask material, and other appropriate mask material. The metallic mask material may include TiN, TaN, etc.

In one embodiment, the patterned second mask layer 204 is made of SiN. The via 206 is formed in the dielectric layer 201 by etching the dielectric layer 201 through a dry etching process using the patterned second mask layer 204 as an etch mask until the surface of the semiconductor substrate 200 is exposed.

The top dimension (e.g., top width) of the via 206 may be larger than the bottom dimension of the via 206 in order to improve the filling effect of a subsequently-formed metal layer. In certain other embodiments, the side surfaces of the via may be perpendicular to the surface of the semiconductor substrate. That is, the top dimension of the via may be the same as the bottom dimension of the via.

In one embodiment, the width of the via 206 may be in a range of 20 nm to 80 nm while the depth of the via 206 may be in a range of 20 nm to 200 nm.

Figure 5:
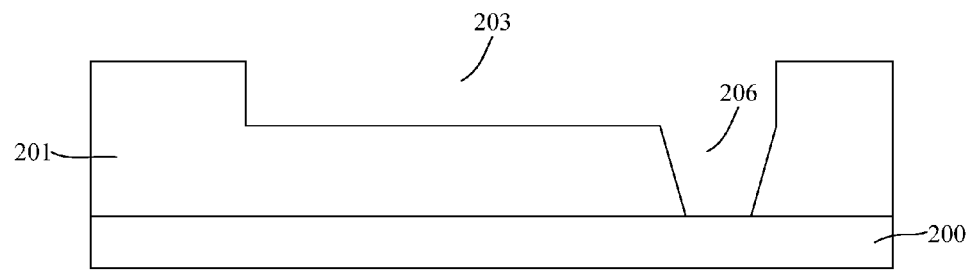

Referring to FIG. 5, after forming the via 206, the patterned second mask layer 204 (referring to FIG. 4) may then be removed. For example, the patterned second mask layer 204 may be removed by wet etching.

The opening formed in the dielectric layer 201 may include both the trench 203 and the via 206 with the via 206 formed below the trench 203. The via 206 and the trench 203 are interconnected with each other. The opening consisting of the via 206 and the trench 203 may be formed in the dielectric layer 201 by a trench first via last method.

In certain other embodiments, the opening in the dielectric layer may be formed by a via first, trench last method. The opening in the dielectric layer may also be formed by an all-in-one process, i.e. the via and the trench may be simultaneously formed.

Figure 6:
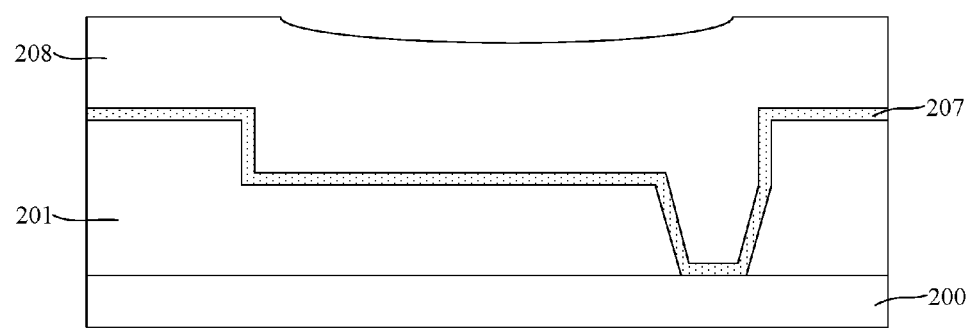

Further, returning to FIG. 11, a metal layer may be formed to fill up the opening (S204). FIG. 6 shows a schematic cross-section view of the corresponding semiconductor structure.

Referring to FIG. 6, a metal layer 208 is formed to fill the opening. That is, the metal layer 208 may fill up the trench 203 (referring to FIG. 5) and the via 206 (referring to FIG. 5). In addition, the metal layer 208 may also cover the top surface of the dielectric layer 201.

In one embodiment, prior to the formation of the metal layer 208, the fabrication method may also include forming a barrier layer 207 on the bottom surface and the side surface of the opening. The barrier layer 207 may prevent the subsequently-formed metal layer 208 from diffusing into the semiconductor substrate 200 or into the dielectric layer 201. Therefore, forming the barrier layer 207 prior to the formation of the metal layer 208 may avoid contamination due to diffusion of the metal layer 208, thus may improve the performance of the formed semiconductor structure. In addition, the barrier layer 207 may also provide a desired interface for subsequent formation of the metal layer 208 so that adhesion between the subsequently-formed metal layer 208 and the dielectric layer 201 may be strong.

The barrier layer 207 may be made of Ti, Ta, W, TiN, TaN, TiSiN, TaSiN, WN, or WC. The barrier layer 207 may have a single-layer or a multiple-layer structure. The barrier layer 207 may be fabricated by a CVD, PVD, or ALD process.

In one embodiment, the barrier layer 207 is made of Ta. The thickness of the barrier layer 207 is in a range of 10 Å to 100 Å. The barrier layer 207 is fabricated by a PVD process.

The metal layer 208 may have a single-layer or a multiple-layer structure. When the metal layer 208 has a single-layer structure, the metal layer 208 may include a metal body layer filling up the opening and also covering the dielectric layer 201. When metal layer 208 has a multiple-layer structure, the metal layer 208 may include a seed layer and a metal body layer.

In one embodiment, the metal layer 208 has a double-layer structure. Specifically, the metal layer 208 includes a seed layer formed on the bottom surface and the side surface of the opening and a metal body layer formed on the surface of the seed layer to fill up the opening.

In one embodiment, the barrier layer 207 is formed on the bottom surface and the side surface of the opening, thus the seed layer may then be formed on the surface of the barrier layer 207.

The seed layer may be used as a cathode during a subsequent electrochemical plating (ECP) process to form the metal body layer. That is, the seed layer is formed as a preparation layer for the subsequent formation of the metal body layer. In addition, the seed layer may also provide a desired interface for subsequent formation of the metal body layer. Specifically, the subsequently-formed metal body layer may strongly adhere to the seed layer so that the electromigration property of the interconnection may be improved.

The seed layer may have a single-layer structure or a multiple-layer structure. The multiple-layer structure may include layers with different grain sizes. For example, the multiple-layer structure may include a small-grain layer and a large-grain layer. When the seed layer has such a multiple-layer structure with the small-grain layer formed under the large-grain layer, adhesion between the seed layer and the barrier layer 207 may be improved.

The seed layer may be fabricated by a PVD process or a CVD process. In one embodiment, the seed layer is formed by a PVD process. The seed layer and the barrier layer 207 may be formed in a same chamber. The thickness of the seed layer is in a range of 10 Å to 200 Å.

The metal body layer is made of copper. The metal body layer may be fabricated by a PVD process or an ECP process. In one embodiment, the metal body layer is formed by an ECP process. Specifically, the semiconductor substrate 200 may be transferred into a plating reaction pool to form the metal body layer through an ECP process.

During the ECP process, copper may gradually fill up the opening. Moreover, a portion of copper may also be formed outside of the opening and may cover the surface of the seed layer to form a copper block.

The ECP reaction pool may include an ECP solution, a metallic copper anode, as well as a positive pole and a negative pole of an electric power source. The ECP solution may mainly contain copper sulfate, sulfuric acid, and water. The ECP solution may also include a variety of additives such as catalyst, inhibitor, adjusting agent, etc.

During the ECP process, the seed layer may be connected to the negative pole of the electric power source while the copper anode may be connected to the positive pole of the electric power source. As such, copper atoms on the copper anode may be converted to copper ions through an oxidation reaction and, in the meantime, copper atoms may be deposited onto the surface of the seed layer to form the metal body layer through a reduction reaction of the copper ions near the surface of the seed layer.

Figure 7:
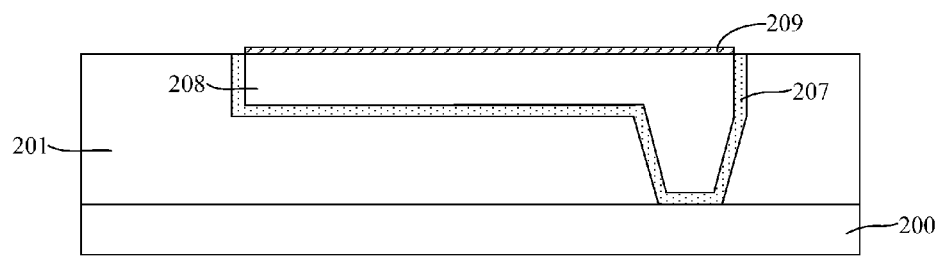

Further, returning to FIG. 11, the portion of the metal layer formed above the top surface of the dielectric layer may be removed (S205). FIG. 7 shows a schematic cross-section view of the corresponding semiconductor structure.

Referring to FIG. 7, the portion of the metal layer 208 formed above the top surface of the dielectric layer 201 may be removed by polishing. After performing the polishing process, the top of the metal layer 208 may be leveled with the top of the dielectric layer 201. In addition, during the polishing process, a metal oxide layer 209 may be formed on the polished metal layer 208.

In one embodiment, a chemical mechanical polishing (CMP) process is used to polish the metal layer 208. The CMP process may also be used to remove the portion of the barrier layer 207 formed above the top surface of the dielectric layer 201. Therefore, after polishing, the top surface of the dielectric layer 201 is exposed.

The metal oxide layer 209 may include both chemical oxide and native oxide. Specifically, the polishing fluid used in the CMP process may contain hydrogen peroxide. Hydrogen peroxide may react with copper atoms at the top surface of the metal layer 208 so that chemical oxide may be formed in the top surface of the metal layer 208 during the CMP process. In addition, oxidation of the metal layer 208 may also occur as the metal layer 208 is exposed to oxygen in ambient air, thus native oxide may be formed in the top surface of the metal layer 208.

Because the chemical reaction and the natural oxidation reaction described above are both relatively weak effects, the metal oxide layer 209 formed on the surface of the metal layer 208 may be porous, while the thickness continuity of the metal oxide layer 209 may also be poor. Specifically, the thickness of the metal oxide layer 209 in some areas may be relatively large while the thickness of the metal oxide layer 209 in other areas may be relatively small, or may even be zero.

Figure 8:
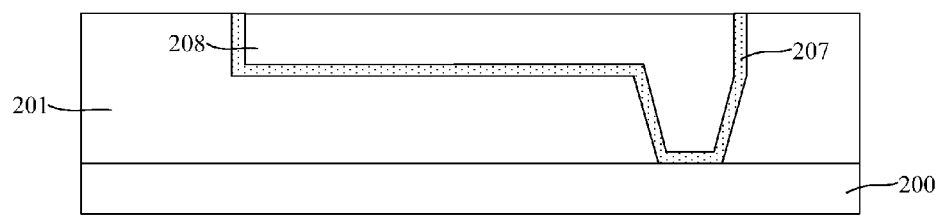

Further, referring to FIG. 11, the metal oxide layer may be removed (S206). FIG. 8 shows a schematic cross-section view of the corresponding semiconductor structure.

Referring to FIG. 8, the metal oxide layer 209 is removed.

In a subsequent process, a metal cap layer may be formed on the metal layer 208 to improve the electromigration resistance of the semiconductor structure so that migration of copper atoms in the metal layer 208 under impact of electrons may be prevented. Because diffusion of copper atoms from the metal layer 208 may be avoided, the metal cap layer may help to resolve the electromigration problems in semiconductor structure.

However, during the formation of the metal cap layer, a silicon-containing gas and a nitrogen-containing gas may be used to treat the surface of the metal layer 208. Because silicon atoms have relatively large migration mobility in the metal layer 208, silicon atoms may easily enter the metal layer 208, causing increase in the resistivity of the metal layer 208. Therefore, prior to the formation of the metal cap layer, a metal barrier layer may be formed on the surface of the metal layer 208. The metal barrier layer may play a role to prevent silicon atoms from diffusing into the metal layer 208. In addition, the metal barrier layer may also provide a processing basis for the subsequently-formed metal cap layer.

Because of the porous texture and the poor continuity of the metal oxide layer 209, the metal oxide layer 209 may not have sufficient capability for preventing silicon atoms from diffusing into the metal layer 208. When the metal cap layer is directly formed on the metal oxide layer 209, a substantial quantity of silicon atoms may still diffuse into the metal layer 208 during the subsequent fabrication process. In addition, the subsequently-formed metal cap layer on the metal oxide layer 209 may still have a porous texture, thus the metal cap layer may not have sufficient capability for preventing migration of copper atoms.

In the present disclosure, the metal oxide layer 209 with a porous texture and poor continuity may be removed. Further, in a subsequent process, a metal barrier layer with a dense texture and a uniform thickness may be formed on the surface of the metal layer 208.

In one embodiment, the metal oxide layer 209 may be removed by a wet etching process. The etching solution used in the wet etching process may be a hydrofluoric acid solution. The volume ratio between deionized water and hydrofluoric acid in the hydrofluoric acid solution may be in a range from 50:1 to 2000:1.

Figure 9:
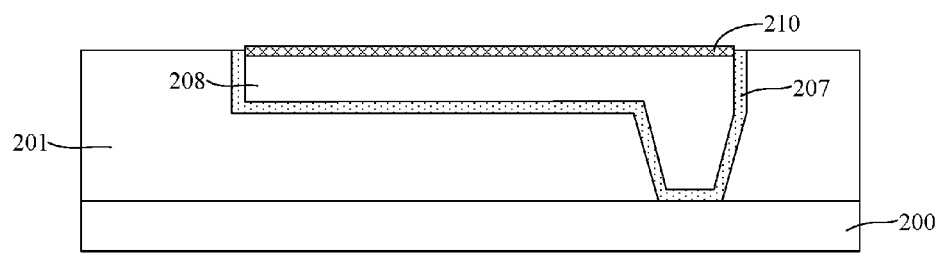

Further, referring to FIG. 11, after removing the metal oxide layer, a metal barrier layer may be formed on the surface of the metal layer (S207). FIG. 9 shows a schematic cross-section view of the corresponding semiconductor structure.

Referring to FIG. 9, a metal barrier layer 210 is formed on the surface of the polished metal layer 208. The thickness of the metal barrier layer 210 may be more uniform than the thickness of the metal oxide layer 209 (referring to FIG. 7) while the texture of the metal barrier layer 210 may be denser than the texture of the metal oxide layer 209.

The metal barrier layer 210 may provide benefits as follows. On one hand, the metal barrier layer 210 may prevent the silicon atoms from diffusing into the metal layer 208 during the subsequent formation process for the metal cap layer, thus increase in the resistivity of the metal layer 208 may be avoided; on the other hand, the metal barrier layer 210 may also provide a processing basis for the formation of the metal cap layer because a portion of the metal barrier layer 210 or the entire metal barrier layer 210 may be converted to the metal cap layer in a subsequent process.

In one embodiment, the formed metal barrier layer 210 may have a dense texture and desired thickness uniformity. Specifically, the metal barrier layer 210 may be denser than the metal oxide layer 209 and the thickness of the metal barrier layer 210 may be more uniform than the thickness of the metal oxide layer 209. Therefore, the metal barrier layer 210 may prevent silicon atoms from diffusing into the metal layer 208. As a result, the metal cap layer formed based on the metal barrier layer 210 may also have a dense texture and desired thickness uniformity so that the formed metal cap layer may sufficiently prevent copper atoms from diffusing, thus the electromigration resistance of the semiconductor structure may be improved.

The metal barrier layer 210 may be made of CuN, CuON, or CuO. In one embodiment, the metal barrier layer 210 is made of CuO. In addition, the metal barrier layer 210 may be fabricated by performing an oxidation treatment process on the surface of the polished metal layer 208 using oxygen ($O_2$), ozone ($O_3$), or superoxide ion ($O_2^-$).

In one embodiment, the oxidation treatment is performed at a reaction temperature in a range of 400° C. to 500° C. Under such a reaction temperature, the oxidation degree of the surface of the metal layer 208 may be high after the completion of the oxidation treatment process. As such, the formed metal barrier layer 210 may not only have a dense texture but also have desired thickness uniformity.

The thickness of the metal barrier layer 210 may not be too small; otherwise, the metal barrier layer 210 may be insufficient to prevent diffusion of silicon atoms, and as a result, silicon atoms may easily penetrate through the metal barrier layer 210 and diffuse into the metal layer 208. The thickness of the metal barrier layer 210 may not be too large either; otherwise, the thickness of the subsequently-formed metal cap layer may also be too large so that the total resistance of the formed semiconductor structure may be very high. In one embodiment, the thickness of the metal barrier layer 210 may be in a range of 3 Å to 20 Å.

Figure 10:
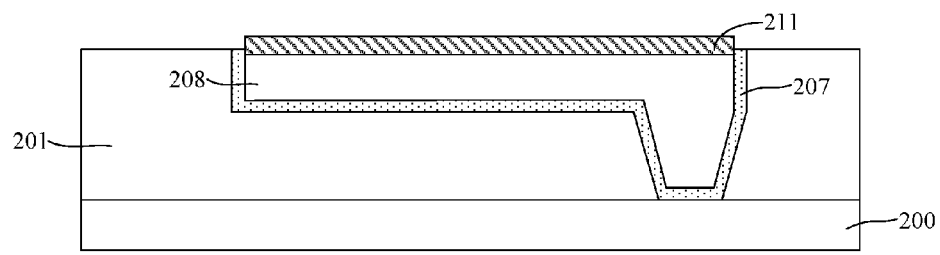

Further, returning to FIG. 11, a self-aligned metal cap layer may be formed from the metal barrier layer by treating the metal barrier layer with a silicon-containing gas (S208). FIG. 10 shows a schematic cross-section view of the corresponding semiconductor structure.

Referring to FIG. 10, a self-aligned metal cap layer 211 is formed based on the metal barrier layer 210 (referring to FIG. 9) by introducing a silicon-containing gas onto the surface of the metal barrier layer 210.

After the treatment process using a silicon-containing gas, the formed metal cap layer 211 may contain both copper atoms and silicon atoms. For example, the metal cap layer 211 may be made of a copper silicon compound (CuSi) after the treatment process by introducing a silicon-containing gas. The metal cap layer 211 may prevent copper atoms in the metal layer 208 from diffusing and thus may improve the electromigration resistance of the semiconductor structure.

In one embodiment, the self-aligned metal cap layer 211 is made of copper silicon nitride compound (CuSiN). Specifically, the resistivity of CuSiN is less than the resistivity of CuSi while the bounding strength of Si atoms in CuSiN is higher than the bounding strength of Si atoms in CuSi. Therefore, using a metal cap layer 211 made of CuSiN may provide better performance in preventing the Si atoms in the metal cap layer 211 from diffusing into the metal layer 208. The metal cap layer 211 may play a role in preventing copper atoms in the metal layer 208 from diffusing. Specifically, the metal cap layer 211 may prevent copper atoms in the metal layer 208 from migration under impact of electrons, thus the electromigration resistance of the semiconductor structure may be improved. In addition to the improved electromigration resistance, the resistivity of the metal cap layer 211 may be relatively small and, as described above, diffusion of silicon atoms from the metal cap layer 211 into the metal layer 208 may also be prevented.

The metal cap layer 211 may be formed by introducing a silicon-containing gas and a nitrogen-containing gas onto the surface of the metal barrier layer 210. The silicon-containing gas may include $SiH_4$, $Si_2H_6$, etc., while the nitrogen-containing gas may include $NH_3$, etc.

When the provided silicon-containing gas is $SiH_4$, during the conversion of the metal barrier layer to the metal cap layer 211, the following chemical reaction may take place:

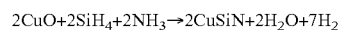

$$2CuO+2SiH_4+2NH_3\rightarrow 2CuSiN+2H_2O+7H_2$$

In one embodiment, the process parameters used for forming the metal cap layer 211 may include: a silicon-containing gas of $SiH_4$; a nitrogen-containing gas of $NH_3$; a flow rate of $SiH_4$ in a range of 100 sccm to 600 sccm; a flow rate of $NH_3$ in a range of 100 sccm to 600 sccm; and a reaction-chamber temperature in a range of 200° C. to 600° C.

Further, the fabrication method for the metal cap layer 211 may also include providing a high-frequency voltage to reduce the reaction temperature for the formation of the metal cap layer 211 and avoid undesired effects caused by an overly high reaction temperature. Specifically, the high-frequency voltage may dissociate the silicon-containing gas and the nitrogen-containing gas so that the required reaction temperature to form the metal cap layer 211 may be reduced. As such, undesired effects on the semiconductor substrate 200 and the dielectric layer due to an overly high reaction temperature may be avoided.

In one embodiment, the process parameters used for forming the metal cap layer 211 may include: a silicon-containing gas of $SiH_4$; a nitrogen-containing gas of $NH_3$; a flow rate of $SiH_4$ in a range of 100 sccm to 600 sccm; a flow rate of $NH_3$ in a range of 100 sccm to 600 sccm; a high-frequency voltage in a range 300 V to 1000 V; an RF power in a range of 500 W to 1500 W; a reaction-chamber temperature in a range of 100° C. to 500° C.

In one embodiment, the entire metal barrier layer 210 (referring to FIG. 9) may be converted to the metal cap layer 211. In certain other embodiments, the metal cap layer may be formed by converting a portion of the metal barrier layer 210.

Because the metal barrier layer 210 has a dense texture and desired thickness uniformity, during the formation of the metal cap layer 211, the metal barrier layer 210 may be able to efficiently prevent silicon atoms from diffusing into the metal layer 208 thus may avoid increasing the resistance of the metal layer 208. Also, because the metal barrier layer 210 has a dense texture and desired thickness uniformity, the metal cap layer 211 formed based on the metal barrier layer 210 may also have a dense texture and desired thickness uniformity. That is, the quality of the formed metal cap layer 211 may also be desired. Therefore, the formed metal cap layer 211 may be capable of preventing copper atoms in the metal layer 208 form diffusing so that the electromigration resistance of the semiconductor structure may be significantly improved.

The present disclosure also provides a semiconductor structure. Referring to FIG. 10, the semiconductor structure may include a semiconductor substrate 200 and a dielectric layer 201 formed on the top of the semiconductor substrate 200. A trench and a via may be formed in the dielectric layer with the via formed below the trench. The bottom of the via may expose a portion of the surface of the semiconductor substrate 200 (referring to FIG. 5). The semiconductor structure may include a barrier layer 207 formed on the bottom and the side surfaces of the trench and the via. The semiconductor structure may further include a metal layer 208 formed on the top of the barrier layer 207. The metal layer 208 may fill up the trench and the via. Finally, the semiconductor structure may include a metal cap layer 211 formed to cover the top surface of the metal layer 208.

Compared to existing methods, the disclosed method includes removing the portion of the metal layer formed above the top surface of the dielectric layer through a polishing process. Because a metal oxide layer may be formed on the top surface of the metal layer during the polishing process and the metal oxide layer may not have sufficient capability for preventing silicon atoms from diffusing into the metal layer, an etching process may be performed to remove the metal oxide layer. Further, the disclosed method includes forming a metal barrier layer on the surface of the metal layer. The thickness of the formed metal barrier layer may be more uniform than the thickness of the metal oxide layer while the texture of the metal barrier layer may also be denser than the texture of the metal oxide layer. Finally, the method includes converting the entire metal barrier layer or a portion of the metal barrier layer into a metal cap layer by inducing a silicon-containing gas onto the surface of the metal barrier layer.

In the present disclosure, the metal barrier layer may have a dense texture and desired thickness uniformity. Specifically, the texture of the metal barrier layer may be denser than the texture of the metal oxide layer while the thickness of the metal barrier layer may also be more uniform than the thickness of the metal oxide layer. Therefore, the metal barrier layer may be able to efficiently prevent silicon atoms from diffusing into the metal layer and, thus, may avoid increasing the resistance of the metal layer. Also, because the metal barrier layer may have a dense texture and desired thickness uniformity, the metal cap layer formed based on the metal barrier layer may also demonstrate advanced properties such as dense texture and thickness uniformity. Therefore, the metal cap layer may be able to efficiently prevent copper atoms in the metal layer from diffusing, thus may improve the electromigration resistance of the semiconductor structure.

Further, during the formation of the metal cap layer, a high-frequency electric voltage may be provided to dissociate the silicon-containing gas and the nitrogen-containing gas. As a result, the required reaction temperature for forming the metal cap layer may be reduced. Therefore, undesired effects on the semiconductor substrate and the dielectric layer due to an overly high reaction temperature may be avoided, thus the electric performance of the semiconductor structure may be further improved.

Moreover, the thickness of the metal barrier layer may be in a range of 3 Å to 20 Å. Therefore, the metal barrier layer may not only prevent the silicon atoms from diffusing into the metal layer but also ensure a moderate thickness for the subsequently-formed metal cap layer based on the metal barrier layer. With such a moderate thickness, the metal cap layer may be able to effectively prevent the diffusion of copper atoms and improve the electromigration resistance of the semiconductor structure, and in the meantime, increase in the overall resistance of the semiconductor structure due to an excessively thick metal cap layer may also be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a dielectric layer on a top surface of a semiconductor substrate;
   forming an opening in the dielectric layer to expose a portion of the top surface of the semiconductor substrate;
   forming a metal layer to fill up the opening and to cover a top surface of the dielectric layer;
   removing a portion of the metal layer formed above the top surface of the dielectric layer by polishing, wherein a metal oxide layer is formed on a top surface of the metal layer;
   removing the metal oxide layer from the top surface of the metal layer;

forming a metal barrier layer on the top surface of the metal layer after removal of the metal oxide layer to provide a more uniform thickness and a denser texture; and converting the metal barrier layer to a metal cap layer by introducing a silicon-containing gas onto a surface of the metal barrier layer.

2. The method for fabricating the semiconductor device according to claim 1, wherein the metal oxide layer includes chemical oxides and native oxides.

3. The method for fabricating the semiconductor structure according to claim 1, wherein:
a chemical mechanical polishing process is used to polish the metal layer; and
a polishing fluid used in the chemical mechanical polishing process includes hydrogen peroxide.

4. The method for fabricating the semiconductor structure according to claim 1, wherein the metal barrier layer is made of one of CuN, CuON, and CuO.

5. The method for fabricating the semiconductor structure according to claim 1, wherein a thickness of the metal barrier layer is in a range of 3 Å to 20 Å.

6. The method for fabricating the semiconductor structure according to claim 1, wherein:
the metal barrier layer is made of CuO;
the metal barrier layer is formed by an oxidation treatment process performed on the top surface of the metal layer after polishing; and
the oxidation treatment uses one or more of oxygen, ozone, and superoxide ions.

7. The method for fabricating the semiconductor structure according to claim 6, wherein a reaction temperature used during the oxidation treatment process is in a range of 400° C. to 500° C.

8. The method for fabricating the semiconductor structure according to claim 1, wherein the step of converting the metal barrier layer to the metal cap layer further comprises:
introducing a nitrogen-containing gas onto the surface of the metal barrier layer.

9. The method for fabricating the semiconductor structure according to claim 8, wherein the metal cap layer is made of CuSiN.

10. The method for fabricating the semiconductor structure according to claim 8, wherein:
the silicon-containing gas includes $SiH_4$ and $Si_2H_6$; and
the nitrogen-containing gas includes $NH_3$.

11. The method for fabricating the semiconductor structure according to claim 8, wherein the process to form the metal cap layer includes:
using $SiH_4$ as the silicon-containing gas;
using $NH_3$ as the nitrogen-containing gas;
a flow rate of $SiH_4$ in a range of 100 sccm to 600 sccm;
a flow rate of $NH_3$ in a range of 100 sccm to 600 sccm; and
a reaction temperature in a reaction chamber in a range of 200° C. to 600° C.

12. The method for fabricating the semiconductor structure according to claim 8 further including:
providing a high-frequency voltage to dissociate the silicon-containing gas and the nitrogen-containing gas.

13. The method for fabricating the semiconductor structure according to claim 12, wherein the step of converting the metal barrier layer to the metal cap layer includes:
using $SiH_4$ as the silicon-containing gas;
using $NH_3$ as the nitrogen-containing gas;
a flow rate of $SiH_4$ in a range of 100 sccm to 600 sccm;
a flow rate of $NH_3$ a range of 100 sccm to 600 sccm;
the provided high-frequency voltage in a range of 300 V to 1000 V;
a provided RF power in a range of 500 V to 1500 V; and
a reaction temperature in a reaction chamber in a range of 100° C. to 500° C.

14. The method for fabricating the semiconductor structure according to claim 1, wherein:
the metal oxide layer is removed by a wet etching process;
the wet etching process uses a hydrofluoric acid solution as an etching solution; and
a volume ratio between deionized water and hydrofluoric acid is in a range from 50:1 to 2000:1.

15. The method for fabricating the semiconductor structure according to claim 1, wherein:
the opening further includes a trench and a via; and
the trench and the via are interconnected with each other and the via is formed below the trench.

16. The method for fabricating the semiconductor structure according to claim 1, wherein the metal layer is made of copper.

17. The method for fabricating the semiconductor structure according to claim 1, wherein the dielectric layer is made of one of Si, a low-k dielectric material, and an ultra-low-k dielectric material.

18. The method for fabricating the semiconductor structure according to claim 1, prior to forming the metal layer, further including:
forming a barrier layer on bottom and side surfaces of the opening.

* * * * *